US011513703B2

(12) United States Patent
Christensen et al.

(10) Patent No.: US 11,513,703 B2
(45) Date of Patent: Nov. 29, 2022

(54) APPARATUS FOR MANAGING DATA STORAGE AMONG GROUPS OF MEMORY CELLS OF MULTIPLE RELIABILITY RANKS

(71) Applicant: MICRON TECHNOLOGY, INC., Boise, ID (US)

(72) Inventors: Carla L. Christensen, Boise, ID (US); Avani F. Trivedi, Eagle, ID (US); Tracy D. Evans, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 17/131,842

(22) Filed: Dec. 23, 2020

(65) Prior Publication Data

US 2021/0109667 A1    Apr. 15, 2021

Related U.S. Application Data

(63) Continuation of application No. 16/202,219, filed on Nov. 28, 2018, now Pat. No. 10,891,063.

(51) Int. Cl.
*G06F 3/06* (2006.01)
*G11C 16/04* (2006.01)
*G11C 11/56* (2006.01)
*G11C 16/08* (2006.01)

(52) U.S. Cl.
CPC .......... *G06F 3/0631* (2013.01); *G06F 3/0604* (2013.01); *G06F 3/0679* (2013.01); *G11C 11/5621* (2013.01); *G11C 11/5671* (2013.01); *G11C 16/0483* (2013.01); *G11C 16/08* (2013.01)

(58) Field of Classification Search
CPC .... G06F 3/0631; G06F 3/0604; G06F 3/0679; G11C 11/5621; G11C 11/5671; G11C 16/0483; G11C 16/08
See application file for complete search history.

(56) References Cited

U.S. PATENT DOCUMENTS

| 10,891,063 | B2* | 1/2021 | Christensen | ........ G11C 11/5621 |
| 2014/0003142 | A1* | 1/2014 | Lee | ..................... G06F 12/0246 365/185.03 |
| 2016/0019137 | A1 | 1/2016 | Ellis et al. | |
| 2016/0098213 | A1* | 4/2016 | Franceschini | ......... G06F 3/0679 711/103 |
| 2019/0377681 | A1* | 12/2019 | Hodes | ................. G06F 12/0871 |

* cited by examiner

*Primary Examiner* — Edward J Dudek, Jr.
(74) *Attorney, Agent, or Firm* — Dicke, Billig & Czaja, PLLC

(57) ABSTRACT

Electronic systems might include a plurality of groups of memory cells and a controller for access of the plurality of groups of memory cells that is configured to cause the electronic system to determine whether a reliability of a particular group of memory cells having a particular reliability rank allocated for storing data of a particular data level at a particular memory density is less than a target reliability, and, if so, determine whether the reliability of the particular group of memory cells at a reduced memory density is less than the target reliability, and, in response to determining that the reliability of the particular group of memory cells at the reduced density is less than the target reliability, allocate the particular group of memory cells for storing data of a lower data level and allocate a different group of memory cells for storing data of the particular data level.

22 Claims, 10 Drawing Sheets

APPARATUS FOR MANAGING DATA STORAGE AMONG GROUPS OF MEMORY CELLS OF MULTIPLE RELIABILITY RANKS

RELATED APPLICATION

This Application is a Continuation of U.S. application Ser. No. 16/202,219, titled "APPARATUS AND METHODS FOR MANAGING DATA STORAGE AMONG GROUPS OF MEMORY CELLS OF MULTIPLE RELIABILITY RANKS," filed Nov. 28, 2018, issued as U.S. Pat. No. 10,891,063 on Jan. 12, 2021, which is commonly assigned and incorporated herein by reference.

TECHNICAL FIELD

The present disclosure relates generally to memory and, in particular, in one or more embodiments, the present disclosure relates to apparatus and methods for managing data storage among groups of memory cells of multiple reliability ranks.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

As performance criteria for systems using memory become more demanding, a desire to extend the useful life of the memory of such systems may result.

DETAILED DESCRIPTION

Figure 1:
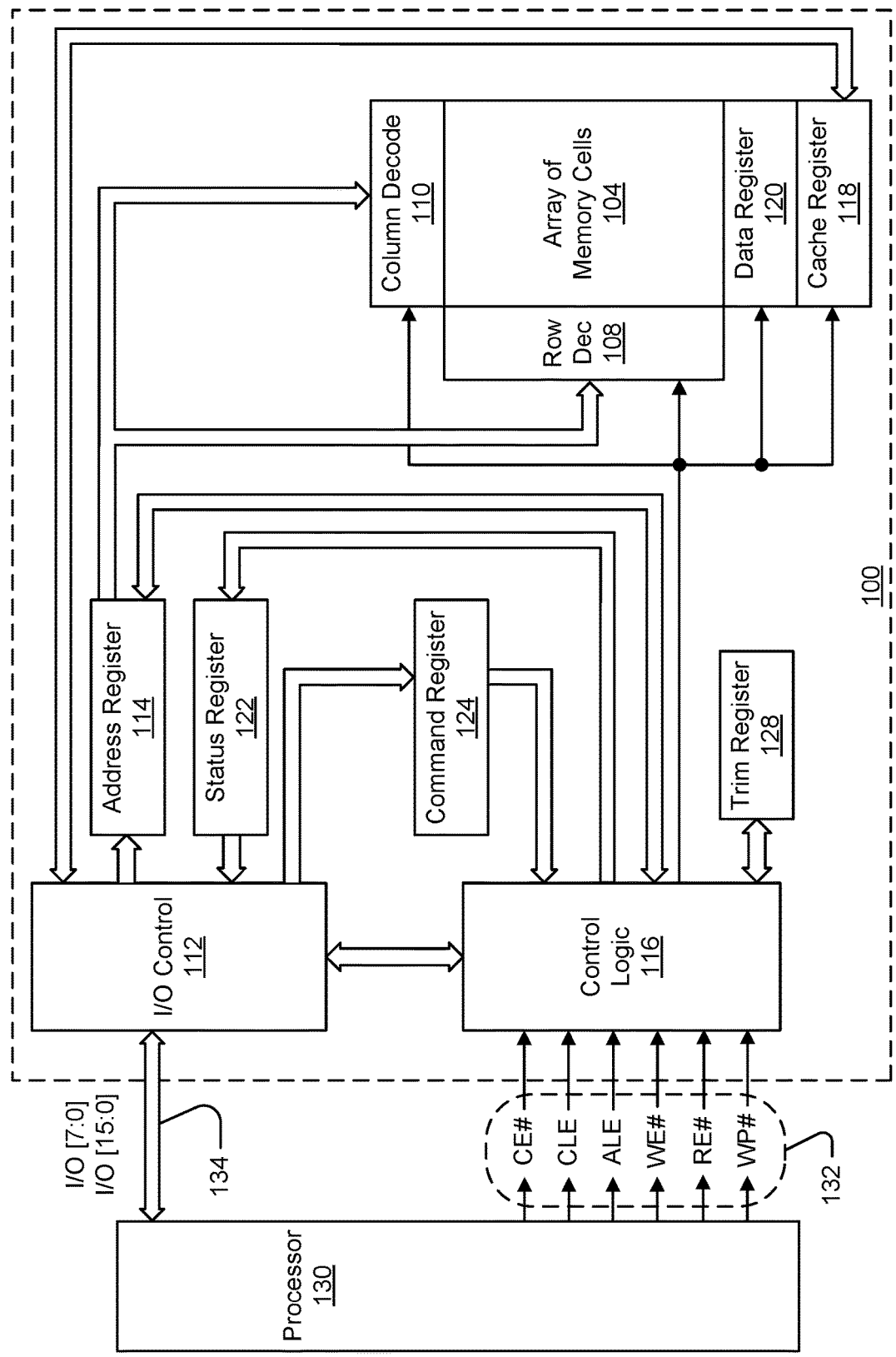
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device or memory die) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device. The processor 130 may be configured to manage storage of data in accordance with embodiments.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 128 may be in communication with the control logic 116 to store trim settings. Although depicted as a separate storage register, trim register 128 may represent a portion of the array of memory cells 104. Trim settings are generally values used by an integrated circuit device to define values of voltage levels, control signals, timing parameters, quantities, options, etc. to be used during operation of that integrated circuit device. The trim register 128 might store information relating to the assignment of ranks and memory densities for a number of different data levels, e.g., different types of data.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown) to sense a data state of a memory cell of the array of memory cells 104. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
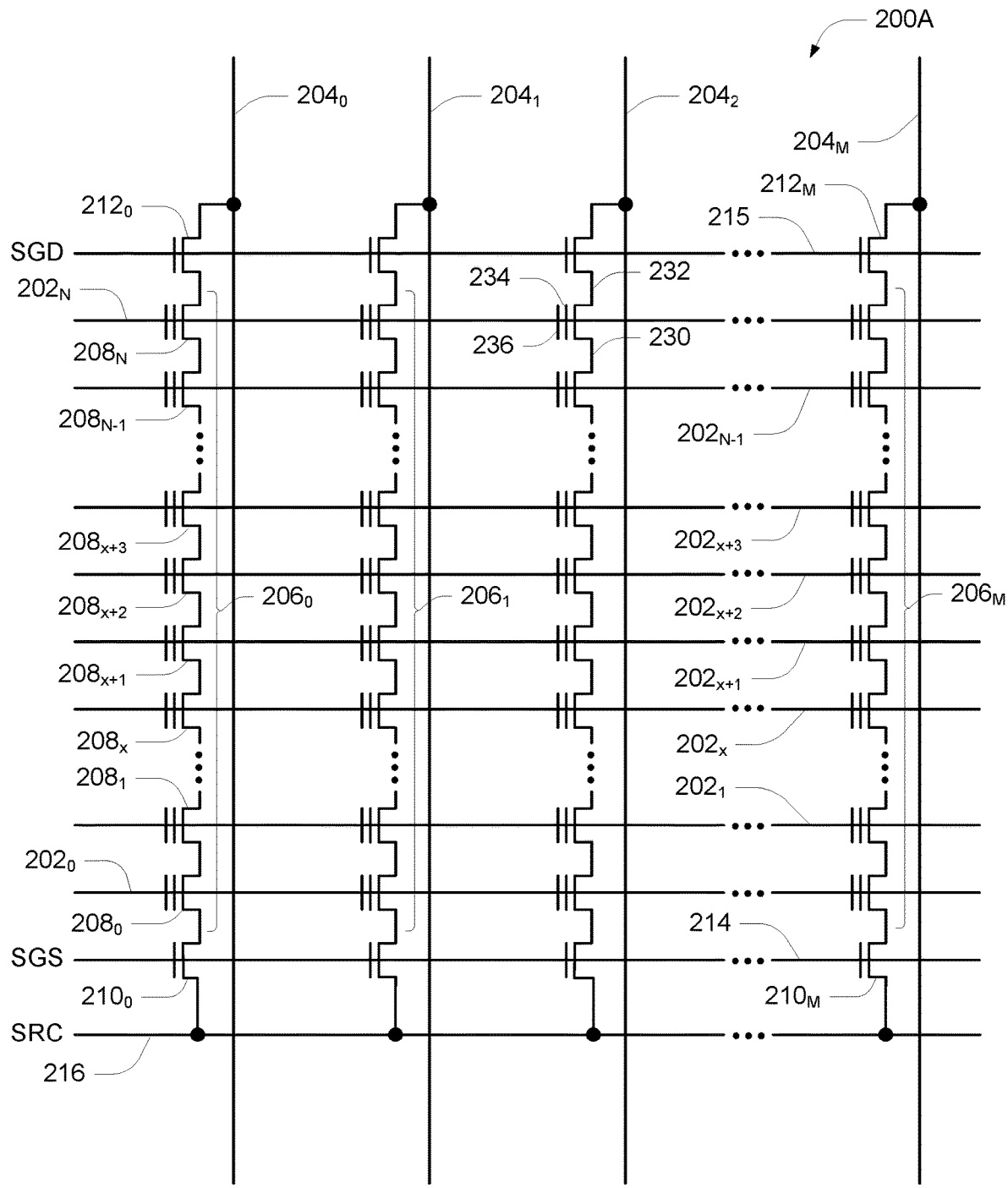
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
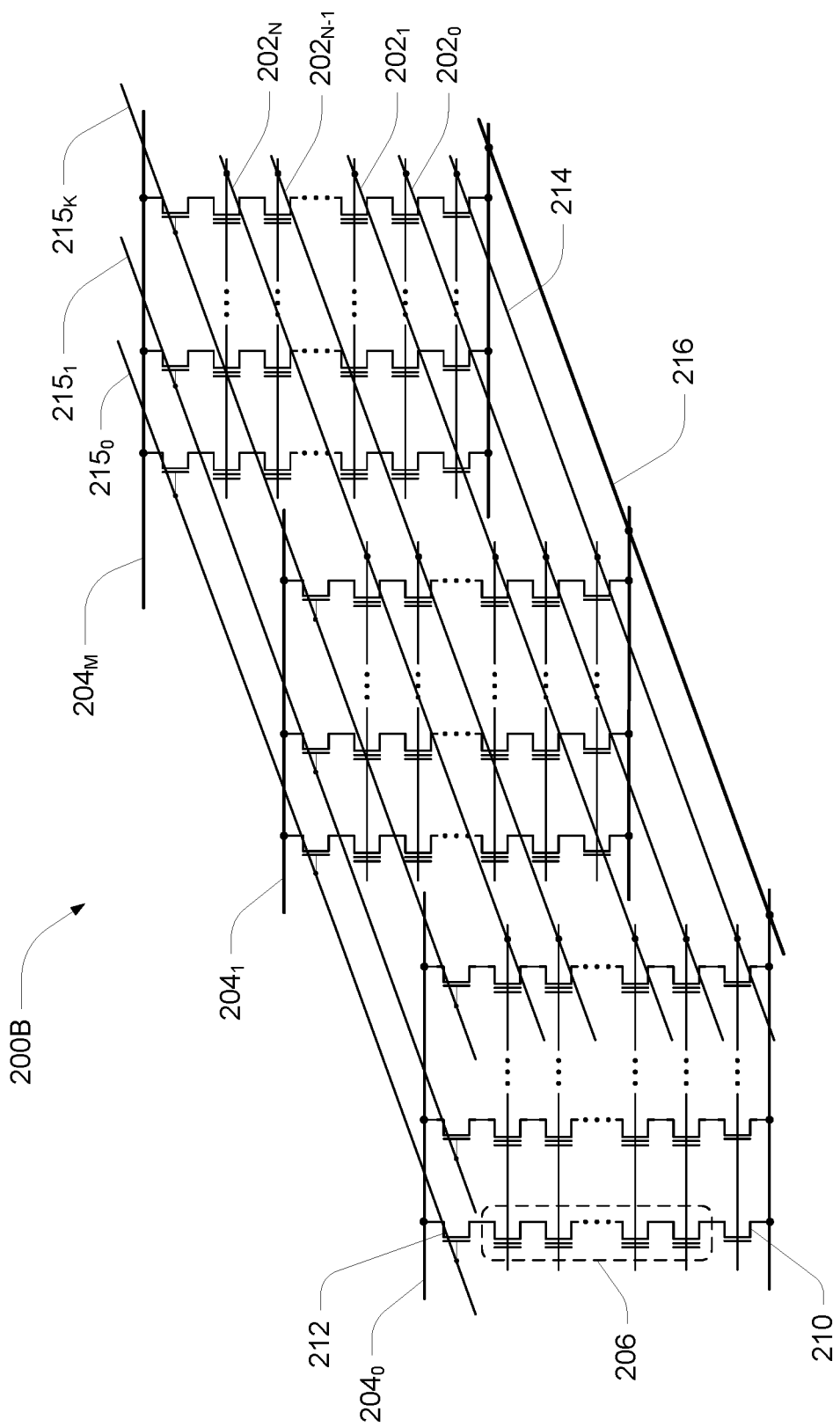

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
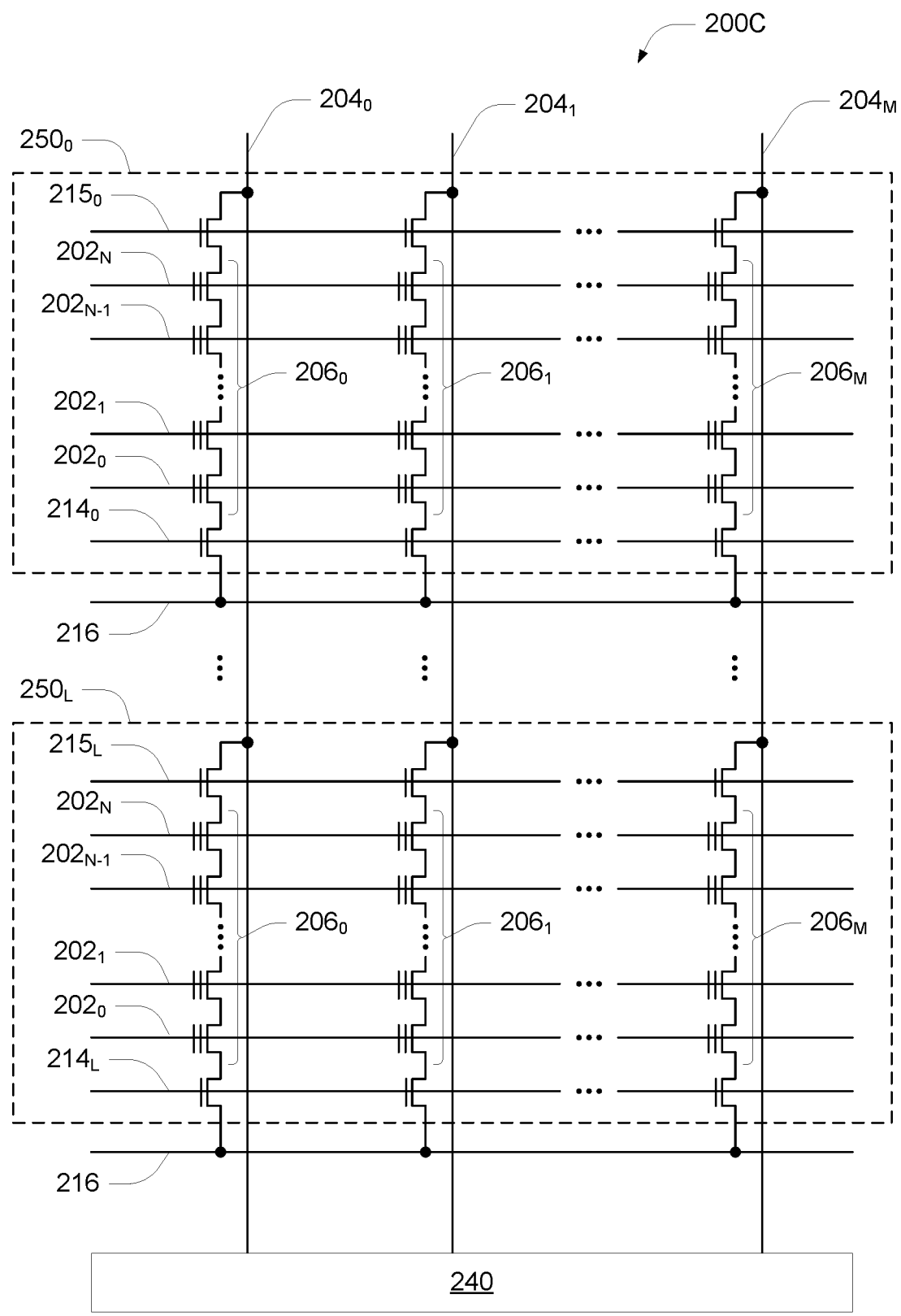

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 214 of one block of memory cells 250 may have no direct connection to access lines 202 and select lines 214 and 214, respectively, of any other block of memory cells 250.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sensing devices (not shown) for sensing data values indicated on respective data lines 204, and corresponding registers (not shown) for storage of the sensed data values from its corresponding memory plane.

Figure 3:
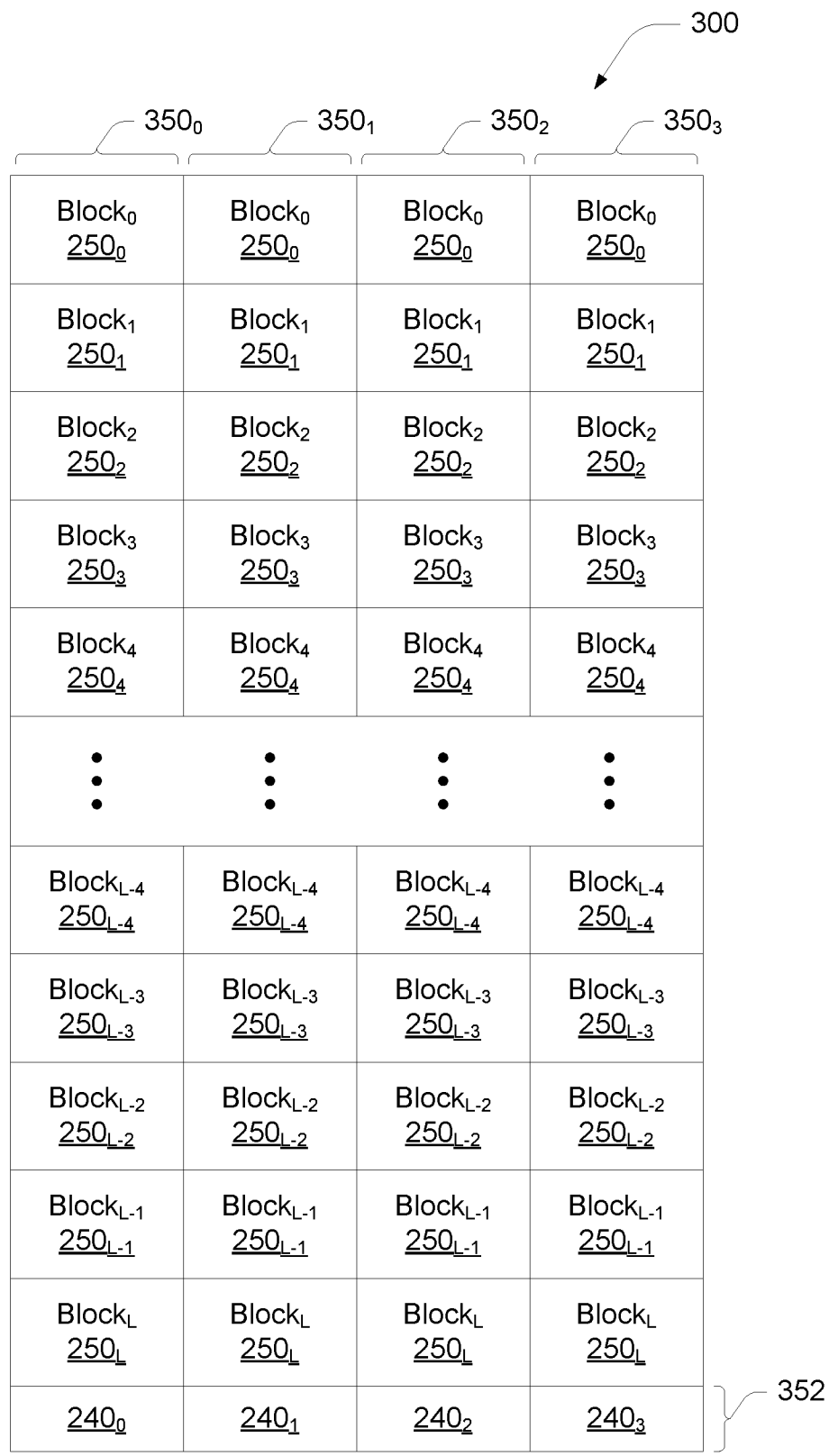
FIG. 3 is a block schematic of a portion of an array of memory cells as could be used in a memory of the type described with reference to FIG. 1.

FIG. 3 is a block schematic of a portion of an array of memory cells as could be used in a memory of the type described with reference to FIG. 1. The array of memory cells 300 is depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L blocks of memory cells 250 (e.g., blocks of memory cells $250_0$-$250_L$).

Figure 4:
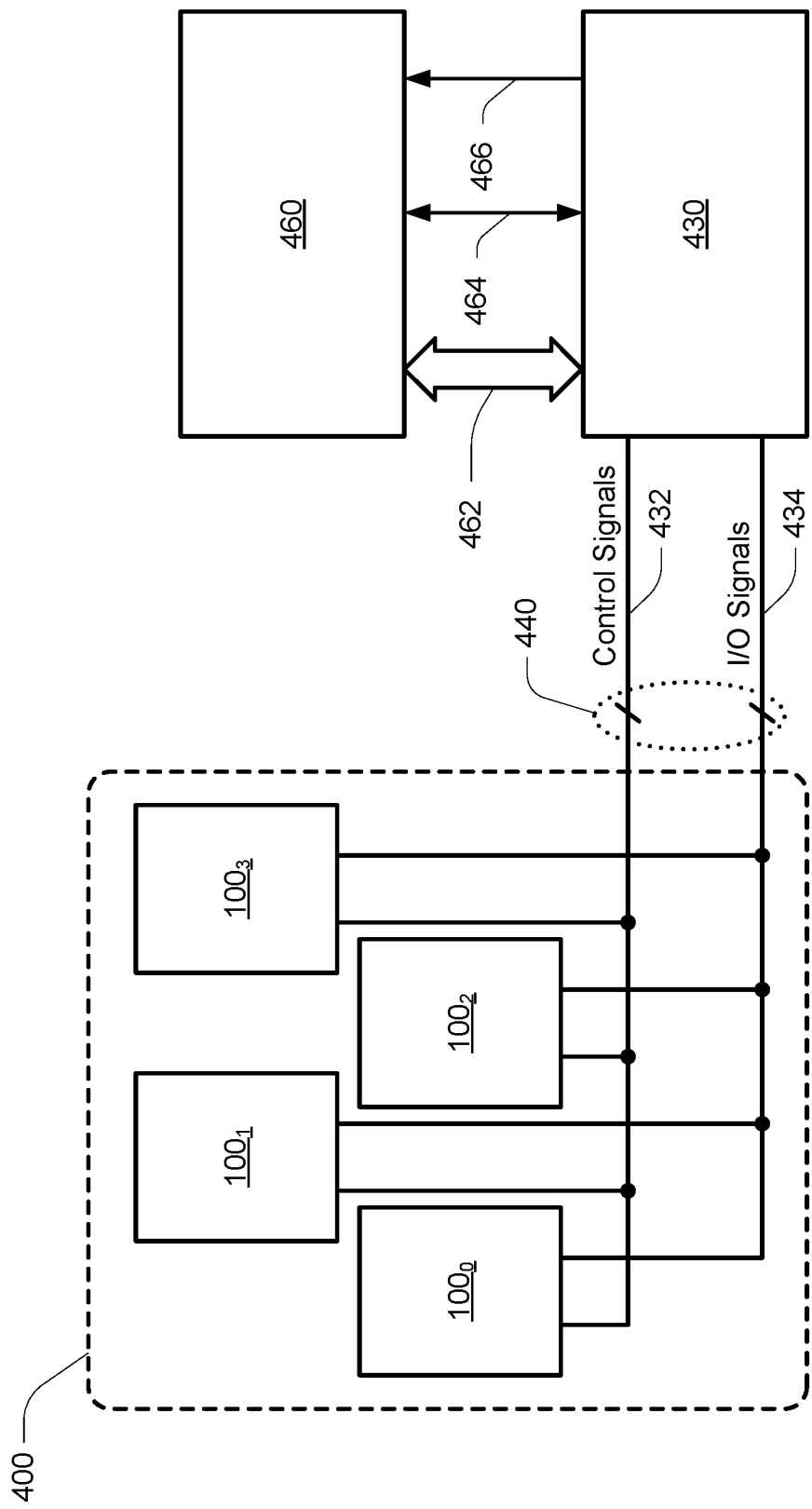
FIG. 4 is a block schematic of a memory package in communication with a controller that is in communication with a host as part of an electronic system, according to an embodiment.

While FIG. 1 depicted a single memory device (e.g., memory die) 100 connected to an external controller, multiple memory 100 might be commonly connected to a signal external controller. FIG. 4 is a block schematic of a memory package, such as a multi-die package, 400 in communication with a controller 430 that is in communication with a host 460 as part of an electronic system, according to an embodiment. The memory package 400 is depicted to include four memory devices or dies 100 (e.g., dies $100_0$-$100_3$). Other numbers of memory dies in a memory package 400 may also be used in various embodiments. As depicted in FIG. 4, each of the memory dies 100 of the memory package 400 may be commonly connected to the control signal nodes 432, commonly connected to the I/O signal nodes 434, commonly connected to the chip enable CE #control signal node 436, and commonly connected to the ready/busy RB #control signal node 438.

The control signal nodes 432 may be connected to signal lines of the control link 132 on a one-to-one basis for each of the memory dies 100. The I/O signal nodes 434 may be connected to signal lines of the I/O bus 134 on a one-to-one basis for each of the memory dies 100. The chip enable CE #control signal node 436 may be connected to the chip enable CE #control signal line 136 of each of the memory dies 100. The ready/busy RB #control signal node 438 may be connected to the ready/busy R/B #signal line 138 of each of the memory dies 100. The control signal nodes 432, I/O signal nodes 434, chip enable CE #control signal node 436, and ready/busy RB #control signal node 438 might collectively form an interface 440 of the memory package 400 for communication with other apparatus, e.g., an external controller 430.

The controller 430 might be a memory controller. The controller 430 may further be in communication with a host device 460, such as a controller of the electronic system. For example, the host device 460 might be the processor of a mobile telephone, digital camera, or other device utilizing one or more memory packages. Because the controller 430 is between the host device 460 and the memory package 400, communication between the host device 460 and the controller 430 may involve different communication links than those used between the controller 430 and the memory package 400. For example, the memory package 400 and controller 430 collectively might represent an Embedded MultiMediaCard (eMMC). In accordance with existing standards, communication with an eMMC may include a data link 462 for transfer of data (e.g., an 8-bit link), a command link 464 for transfer of commands and device initialization, and a clock link 466 providing a clock signal for synchronizing the transfers on the data link 462 and command link 464. The controller 430 may handle many activities autonomously, such as error correction, management of defective blocks, wear leveling and address translation. The controller 430 may be configured to perform methods in accordance with embodiments.

Figure 5:
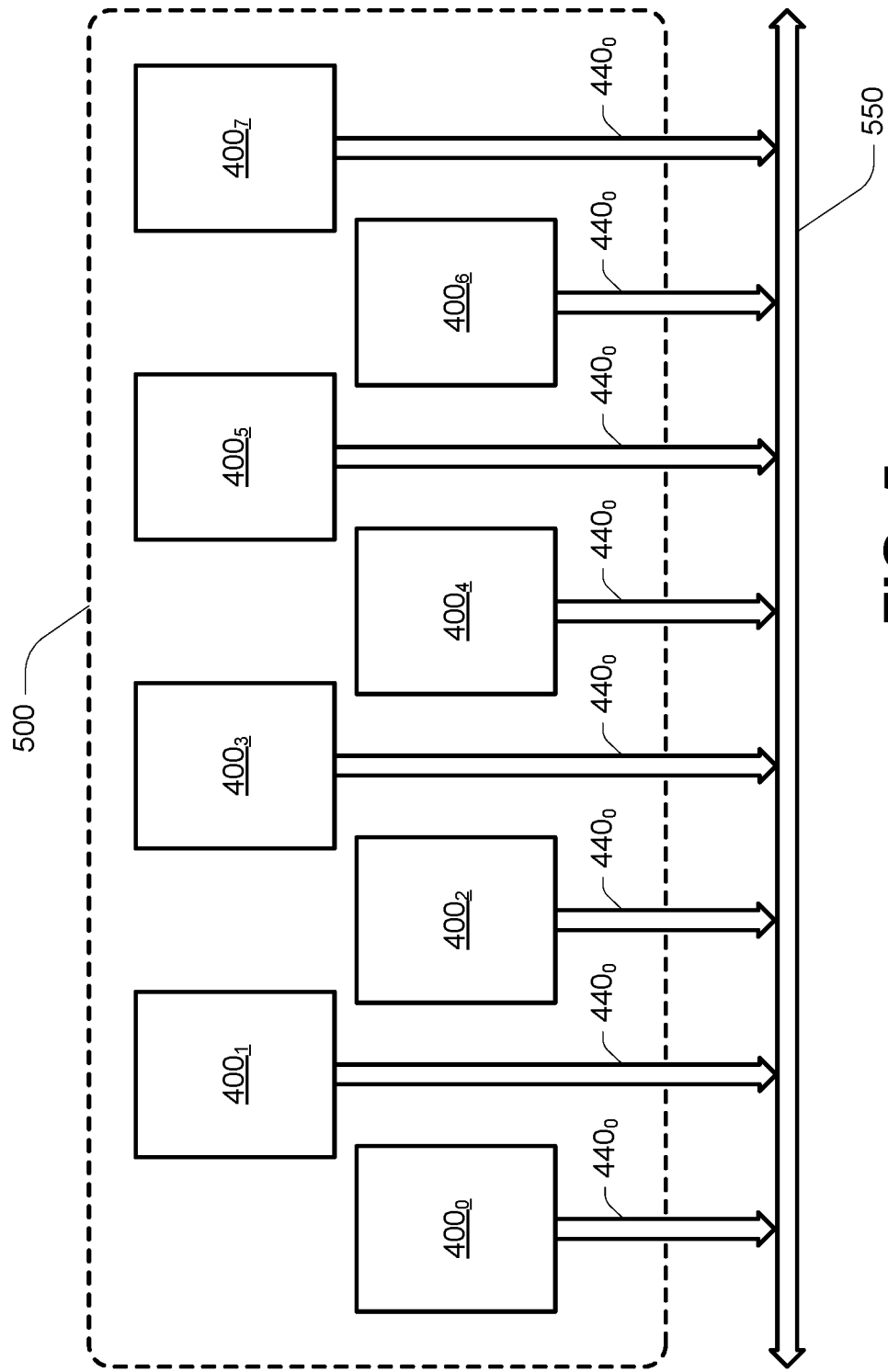
FIG. 5 is a block schematic of a grouping of memory packages connected to a memory communication channel according to an embodiment.

FIG. 5 is a block schematic of a grouping 500 of memory packages (e.g., multi-die packages) 400 connected to a memory communication channel 550 according to an embodiment. The grouping 500 of memory packages 400 of FIG. 4 is depicted to include eight memory packages 400 (e.g., memory packages $400_0$-$400_7$). Other numbers of memory packages 400 may also be used in various embodiments. As depicted in FIG. 5, each memory package 400 may have its interface 440 connected to a memory channel communication link 550.

Figure 6:
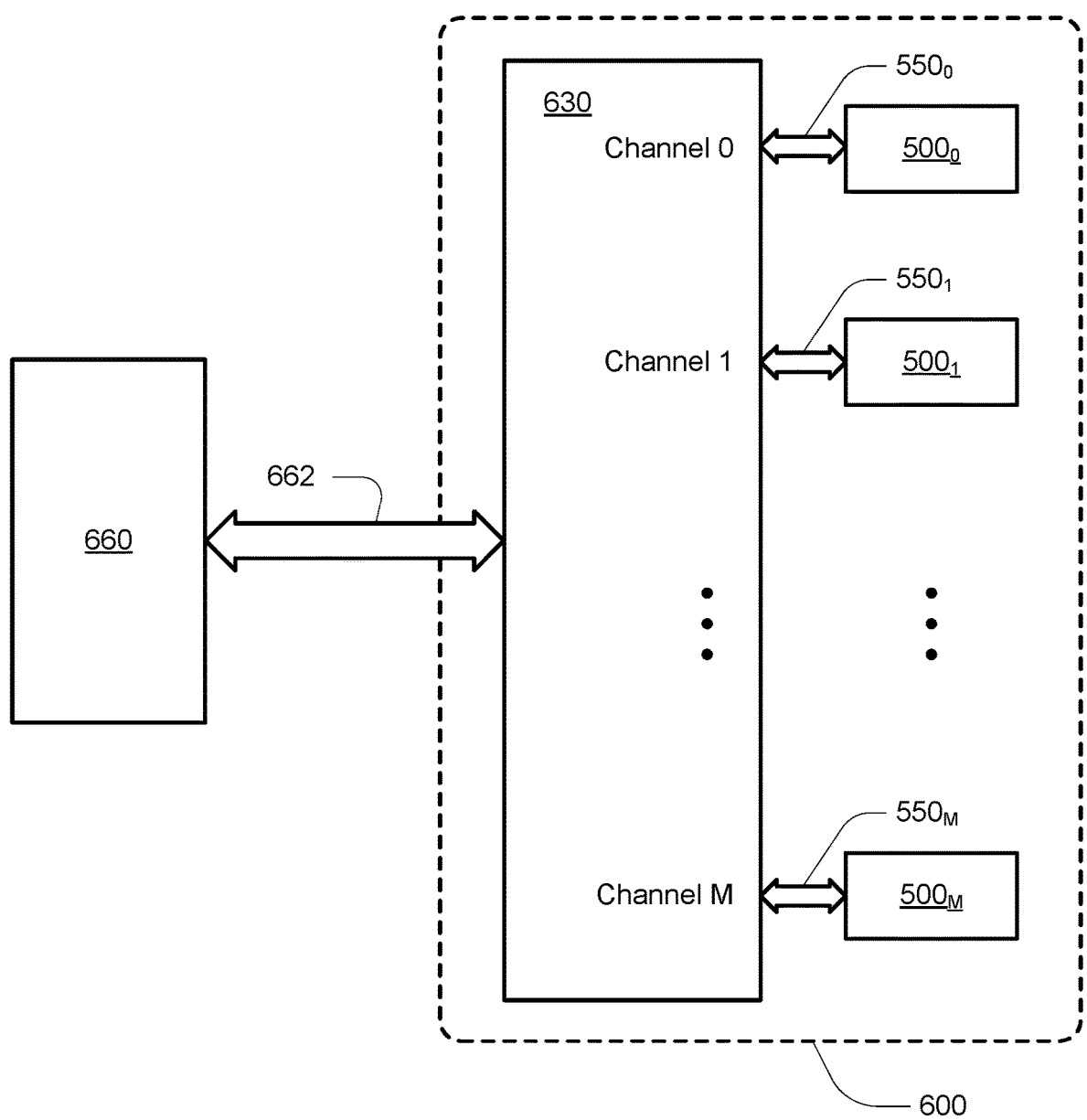
FIG. 6 is a block schematic of a bulk storage device connected to a host device according to an embodiment.

FIG. 6 is a block schematic of a bulk storage device 600 (e.g., an electronic system) connected to a host device 660 according to an embodiment. For example, the bulk storage device 600 might be a solid state drive (SSD) or other device utilizing one or more groupings 500 of memory packages. The bulk storage device 600 may include a controller 630, e.g., a memory controller, having a number of channels (e.g., Channel 0 to Channel M). M is an integer value greater than or equal to zero. Each channel of the controller 630 may be connected to a respective memory channel communication link 550 (e.g., memory channel communication links $550_0$ to $550_M$, respectively) connected to a respective grouping 500 of memory packages (e.g., groupings $500_0$ to $500_M$, respectively).

The controller 630 is further in communication with the host device 660 as part of an electronic system. Because controller 630 is between the host device 660 and the groupings 500 of memory packages, communication between the host device 660 and the controller 630 may involve different communication links than those used between the controller 630 and the groupings 500 of memory packages. For example, the bulk storage device might be a SATA (Serial Advanced Technology Attachment) SSD, such that communication between the host device 660 and the controller 630 may include a SATA link 662 for transfer of Frame Information Structures (FISs) over the SATA link 662 containing control information or payload data. The controller 630 may handle many activities autonomously, such as error correction, management of defective blocks, wear leveling and address translation. The controller 630 may be configured to perform methods in accordance with embodiments.

Following fabrication of a memory (e.g., memory die 100), it is typically tested for performance and reliability characteristics (e.g., characteristics related to the ability to reliably read data over time). During such testing, portions of the array of memory cells of the memory (e.g., groups of memory cells) may be deemed to be unusable, e.g., deemed to be unable to reliably store data at any density level, e.g., SLC (e.g., 1 digit of data per memory cell), MLC (e.g., 2 digits of data per memory cell), TLC (e.g., 3 digits of data per memory cell), QLC (e.g., 4 digits of data per memory cell), etc. These portions might be individual or groupings of pages of memory cells, individual or groupings of blocks of memory cells, individual or groupings of planes of memory cells, etc., including up to the entire array of memory cells. Such portions of the memory might alternatively be deemed to be usable only for some subset of density levels that the memory might be capable of programming. For example, where a memory is capable of programming (e.g., configured to program) a memory cell to any density level selected from the group of SLC, MLC, TLC and QLC, a portion of the array of memory cells of the memory might be deemed to be usable for SLC or MLC storage, but unusable for TLC or QLC storage. The reliability characteristics of portions of the array of memory cells might further be characterized regarding their data retention properties. For example, a portion of the array of memory cells might have a particular retention characteristic (e.g., expected period of reliable storage of data) at one density (e.g., SLC), and might have a lesser (e.g., inferior) retention characteristic at a higher density (e.g., MLC).

In response to the characterization of a memory, the memory, or portions thereof, may be designated with a rank, indicative of the characteristics of the memory (or its individual portions) regarding its determined ability to retain data at different storage densities. In turn, different types of data might be categorized into different data levels that might have different requirements for reliability, and might be assigned to (e.g., constrained to) groups of memory cells of particular ranks. For example, a system may seek to store mission critical data, e.g., data that may be necessary to provide the desired basic functionality of the system, but that may be unrecoverable if it becomes corrupted. The system may further seek to store system data, less critical than mission critical data, e.g., data that may be used by the system in providing its desired functionality. The system may further seek to store other data, less critical than the system data, that might reduce the functionality of the system if it were lost, but that might be easily recoverable, such a reloading applications, maps, images, etc. The system may further seek to store non-critical data, less critical than the other data, e.g., data that could be corrupted or otherwise lost without materially affecting the functionality of the system, such as temporary data, search histories, etc. A system could utilize other levels of criticality or other criteria for categorizing its data into different data levels, and the foregoing are merely examples.

Based on the determined characteristics of the different ranks of various groups of memory cells, the system may determine which ranks are deemed to be suitable for each of the different data levels. Table 1 is an example showing assignments of four data levels (e.g., $DataLevel_1$-$DataLevel_4$) of decreasing criticality, e.g., having decreasing requirements related to reliability, to five ranks of groups of memory cells (e.g., $Rank_1$-$Rank_5$) of decreasing attributes, e.g., having decreasing performance characteristics related to reliability.

TABLE 1

|  | $DataLevel_1$ | $DataLevel_2$ | $DataLevel_3$ | $DataLevel_4$ |
| --- | --- | --- | --- | --- |
| $Rank_1$ | Yes | Yes | Yes | Yes |
| $Rank_2$ | Yes | Yes | Yes | Yes |
| $Rank_3$ | Yes | Yes | Yes | Yes |
| $Rank_4$ | No | Yes | Yes | Yes |
| $Rank_5$ | No | No | Yes | Yes |

In the example of Table 1, data of the data level $DataLevel_1$ might be constrained to any of ranks of groups of memory cells $Rank_1$-$Rank_3$, data of the data level $DataLevel_2$ might be constrained to any of ranks of groups of memory cells $Rank_1$-$Rank_4$, and data of the data levels $DataLevel_3$ and $DataLevel_4$ might be constrained to any of ranks of groups of memory cells $Rank_1$-$Rank_5$.

In addition to assigning data of differing data levels to different ranks of groups of memory cells, the system, in response to the characteristics of the various ranks of groups of memory cells, might further assign (e.g., constrain) use of the ranks of groups of memory cells to specific memory densities (e.g., to specific maximum memory densities) for each data level. Table 2 is an example showing assignments of four data levels (e.g., $DataLevel_1$-$DataLevel_4$) of decreasing criticality, e.g., having decreasing requirements related to reliability, to five ranks of groups of memory cells (e.g., $Rank_1$-$Rank_5$) of decreasing attributes, e.g., having decreasing performance characteristics relate to reliability, with regard to specific memory densities (e.g., maximum memory densities) deemed to be suitable for the various combinations.

TABLE 2

|  | $DataLevel_1$ | $DataLevel_2$ | $DataLevel_3$ | $DataLevel_4$ |
| --- | --- | --- | --- | --- |
| $Rank_1$ | TLC | TLC | TLC | TLC |
| $Rank_2$ | MLC | MLC | TLC | TLC |
| $Rank_3$ | SLC | MLC | MLC | TLC |
| $Rank_4$ | N/A | SLC | SLC | MLC |
| $Rank_5$ | N/A | N/A | SLC | SLC |

In the example of Table 2, each of the data levels $DataLevel_1$-$DataLevel_4$ might be permitted to store data in a group of memory cells having the rank $Rank_1$ at a TLC memory density, e.g., three digits of data per memory cell, the data levels $DataLevel_3$ and $DataLevel_4$ might further be permitted to store data in a group of memory cells having the rank $Rank_2$ at the TLC memory density, and the data level $DataLevel_4$ might further be permitted to store data in a group of memory cells having the rank $Rank_3$ at the TLC memory density. In addition, the data level $DataLevel_1$ might be permitted to store data in a group of memory cells having the rank $Rank_2$ at an MLC memory density, e.g., two digits of data per memory cell, the data level $DataLevel_2$ might be permitted to store data in a group of memory cells having the ranks $Rank_2$-$Rank_3$ at the MLC memory density, the data level $DataLevel_3$ might be permitted to store data in a group of memory cells having the rank $Rank_3$ at the MLC memory density, and the data level $DataLevel_4$ might be permitted to store data in a group of memory cells having the rank $Rank_4$ at the MLC memory density. Furthermore, the data level $DataLevel_1$ might be permitted to store data in a group of memory cells having the rank $Rank_3$ at an SLC memory density, e.g., one digit of data per memory cell, the data level $DataLevel_2$ might be permitted to store data in a group of memory cells having the rank $Rank_4$ at the SLC memory density, the data level $DataLevel_3$ might be permitted to store data in a group of memory cells having the ranks $Rank_4$-$Rank_5$ at the SLC memory density, and the data level $DataLevel_4$ might be permitted to store data in a group of memory cells having the rank $Rank_5$ at the SLC memory density. The system might inhibit (e.g., disallow) storage of data of the data level $DataLevel_1$ in a group of memory cells having the ranks $Rank_4$-$Rank_5$ at, and the system might inhibit storage of data of the data level $DataLevel_2$ in a group of memory cells having the rank $Rank_5$.

It is noted that the ranking of groups of memory cells might be performed at a variety of granularities. For example, groups of memory cells might be physical pages of memory cell, blocks of memory cells, planes of memory cells, entire arrays of memory cells, multiple memory dies, etc., and any combination thereof. Their ranking might be considered to indicate a minimum level of reliability for that group of memory cells, e.g., a page of memory cells might be assigned to a rank based on the performance characteristics of its lesser-performing memory cells, a block of memory cells might be assigned to a rank based on the performance characteristics of its lesser-performing pages of memory cells, a memory package might be assigned to a rank based on the performance characteristics of its lesser-performing memory dies, etc. For some embodiments, data of a particular data level is preferentially stored to available (e.g., free) groups of memory cells of a highest rank and/or highest memory density to which that particular data level is assigned. Although the foregoing example included all data levels $DataLevel_1$-$DataLevel_4$ being assigned to the rank Rank1, the $Rank_1$ might alternatively be assigned solely to data level $DataLevel_1$, and the system might inhibit storing data of the remaining data levels $DataLevel_2$-$DataLevel_4$ to the rank $Rank_1$.

The ranking of groups of memory cells might facilitate the use of memory die that might otherwise be deemed to be unusable. For example, a memory might have an excessive number of bad blocks of memory cells, or one or more bad planes of memory cells, and might be deemed to be unable to perform in a manner deemed necessary to support all data levels expected to be stored to a system containing the memory. Consider the foregoing example, where groups of memory cells having the ranks $Rank_4$-$Rank_5$ are deemed to be unsuitable to store data of the data levels $DataLevel_1$ and/or $DataLevel_2$. Such groups of memory cells would not be able to be placed into the pool of available memory for a system requiring performance characteristics to store data of the data level $DataLevel_1$. By ranking the groups of memory cells, and allocating the different ranks to the groups of memory cells accordingly, these groups of memory cells deemed unusable for one type of data might be made to be useful for other types of data, thus providing value to parts that might otherwise be deemed to be trash.

As an example, in the memory package 400 of the electronic system of FIG. 4 having four memory dies 100, the memory dies $100_0$ and $100_1$ might be deemed suitable for any level of data the system is rated to store, while the memory dies $100_2$ and $100_3$ might be deemed to be unsuitable to store data of at least one level of data the system is rated to store. The memory dies $100_0$ and $100_1$ might further provide for the entire rated capacity of the system at the time of fabrication. By providing the memory dies $100_2$ and $100_3$, the useful life of the system might be extended by permitting the movement of lower data levels from the memory dies $100_0$ and $100_1$ to the memory dies $100_2$ and $100_3$ as the memory density of the memory dies $100_0$ and $100_1$ is reduced, thereby maintaining the rated reliability for all data levels, without reducing the rated capacity. The rated reliability might be a particular value of any metric, or combination of metrics, related to the ability of the system to reliably store data over time.

In operation, data of a particular data level might be stored to groups of memory cells of a particular rank or subset of ranks. To continue the foregoing example, data of the data level $DataLevel_1$ might be stored to groups of memory cells having the rank $Rank_1$ at the TLC memory density. However, as the memory device ages, e.g., an increasing number of program/erase cycles, its performance characteristics may change, e.g., degrade, and groups of memory cells originally having the rank $Rank_1$ may no longer be able to reliably store data of the data level $DataLevel_1$ at the TLC memory density. Such groups of memory cells might need to reduce the memory density, such as to the MLC memory density, to continue to reliably store such data. Reducing the memory density necessarily means that the memory cells can no longer store as much data, which might require additional groups of memory cells allocated to store data of the data level $DataLevel_1$. The need for additional groups of memory cells allocated to store data of a particular data level may further come about for other reasons, such as a simple desire to store larger amounts of data of the particular data level. Various embodiments describe methods of operating a system to manage data storage of the type described.

Figure 7:
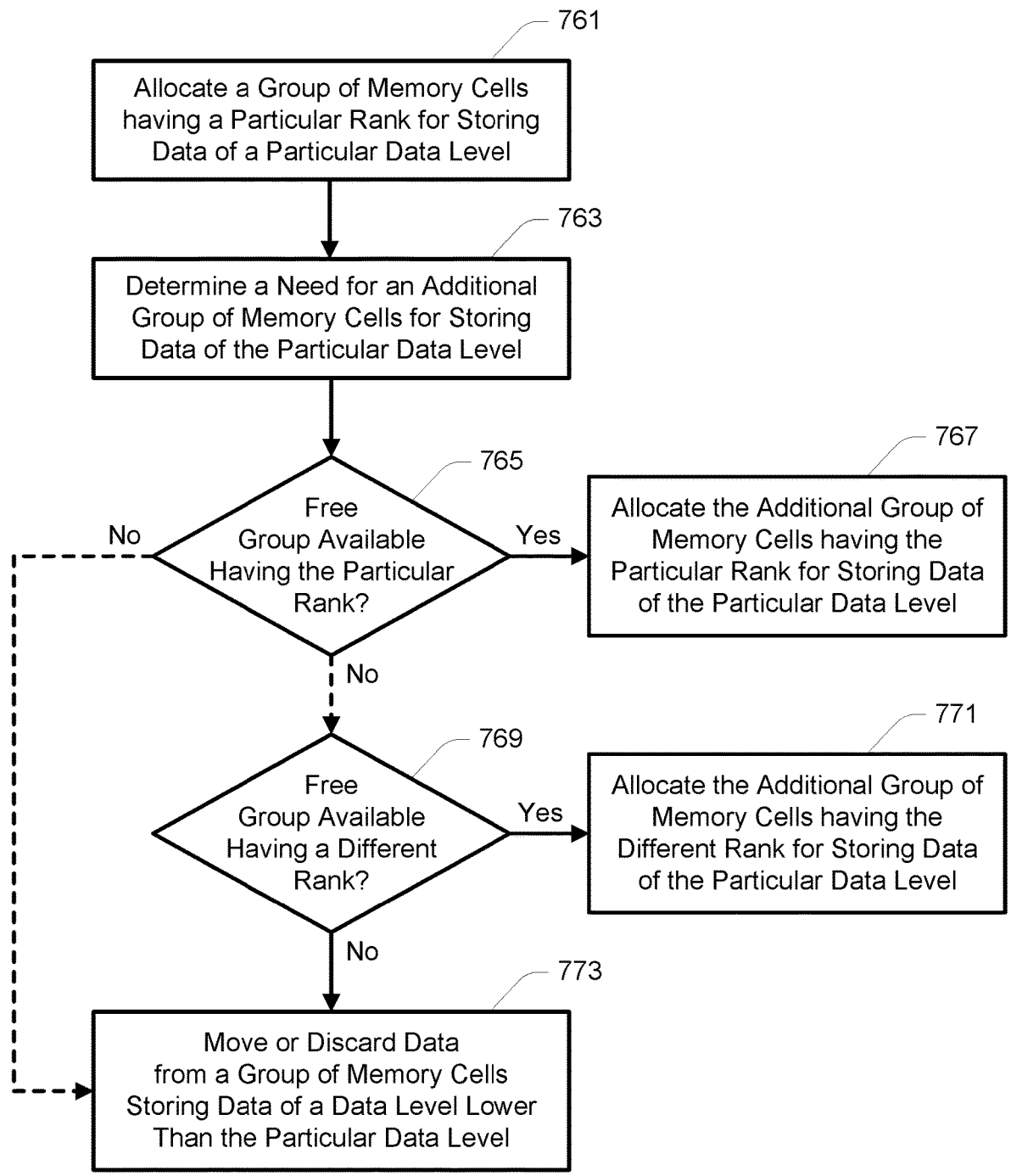
FIG. 7 is a flowchart of a method of operating an electronic system according to an embodiment.

FIG. 7 is a flowchart of a method of operating an electronic system according to an embodiment. The method of FIG. 7 might be performed in response to reducing a memory density of one or more groups of memory cells allocated for storing data of a particular data level, and/or in response to identifying a need to store additional data of the particular data level in excess of an amount already allocated.

At 761, a group of memory cells having a particular rank might allocated for storing data of a particular data level. For example, data of the data level $DataLevel_1$ might be allocated to blocks of memory cells (or other grouping of memory cells) having the rank $Rank_1$ having the TLC memory density. Allocating a group of memory cells having a particular rank might include allocating a group of memory cells having any rank of a subset of the ranks. For example, data of the data level $DataLevel_1$ might be allocated to blocks of memory cells (or other grouping of memory cells) having any of the ranks $Rank_1$-$Rank_3$ having their corresponding memory densities.

At 763, a need for an additional group of memory cells for storing data of the particular data level might be determined. For example, where groups of memory cells allocated to storing data of the particular data level are deemed to no longer support a particular memory density, and are limited to storing data of the particular data level at a lower memory density, one or more additional groups of memory cells might be needed to replace the lost storage capacity.

At 765, it is determined whether a free group of memory cells having the particular rank (e.g., or a rank of a subset of ranks) is available. A group of memory cells is deemed to be free when it is erased or otherwise contains no valid data. If a free group of memory cells is available at 765, this additional group of memory cells having the particular rank (e.g., or a rank of that subset of ranks) might be allocated to store data of the particular data level at 767. If a free group of memory cells is not available at 765, the process might proceed to 773 to move or discard data from a group of memory cells (e.g., of the particular rank or a rank of that subset of ranks) storing data of a data level lower than the particular data level. The moving or discarding of data of a lower data level might be selected to be data of a lowest data level of the particular rank or a rank of a subset of ranks, and might further be selected to be an oldest data of that data level. Alternatively, if a free group of memory cells is not available at 765, the process might proceed to 769.

At 769, it is determined whether a free group of memory cells having different rank (e.g., or a rank of a subset of ranks) is available. If a free group of memory cells is available at 769, this additional group of memory cells having the different rank (e.g., or a rank of that subset of ranks) might be allocated for storing data of the particular data level at 771. If a free group of memory cells is not available at 769, the process might proceed to 773 to move or discard data from a group of memory cells (e.g., of the different rank or a rank of that subset of ranks) storing data of a data level lower than the particular data level. The moving or discarding of data of a lower data level might be selected to be data of a lowest data level of the different rank or a rank of that subset of ranks, and might further be selected to be an oldest data of that data level.

For some embodiments, the discarding of data might be limited to data levels defined by the system to be permissible to discard. The moving of data of a lower data level might define a need for an additional group of memory cells for storing the data of the lower data level. The process of 765-773 might then be repeated to allocate a group of memory cells for storing this data. In such a circumstance, the particular rank might become a next rank below the rank from which the data is to be moved. For example, where the particular rank at 765 was the rank Rank' before it was determined to move the data, and no lower ranks were investigated before determining a need to move the data (e.g., proceeding directly from 765 to 773), the particular rank at 765 might become the next lower rank Rank$_e$, e.g., because no free group of memory cells was identified in the rank Rank$_1$. It is noted that the same particular rank could be used in repeating the process of 765-773, acknowledging that it has already been determined to not contain a free group of memory cells. Alternatively, where the particular rank at 765 was the rank Rank$_1$ before it was determined to move the data, and no lower rank was determined to have a free group of memory cells available (e.g., proceeding from 765, to 769, to 773), the particular rank at 765 might become the lowest rank Rank$_5$, e.g., because no free group of memory cells was identified in any rank. Again, it is noted that the same particular rank could be used in repeating the process of 765-773, acknowledging that it, and each remaining rank, has already been determined to not contain a free group of memory cells.

Figure 8:
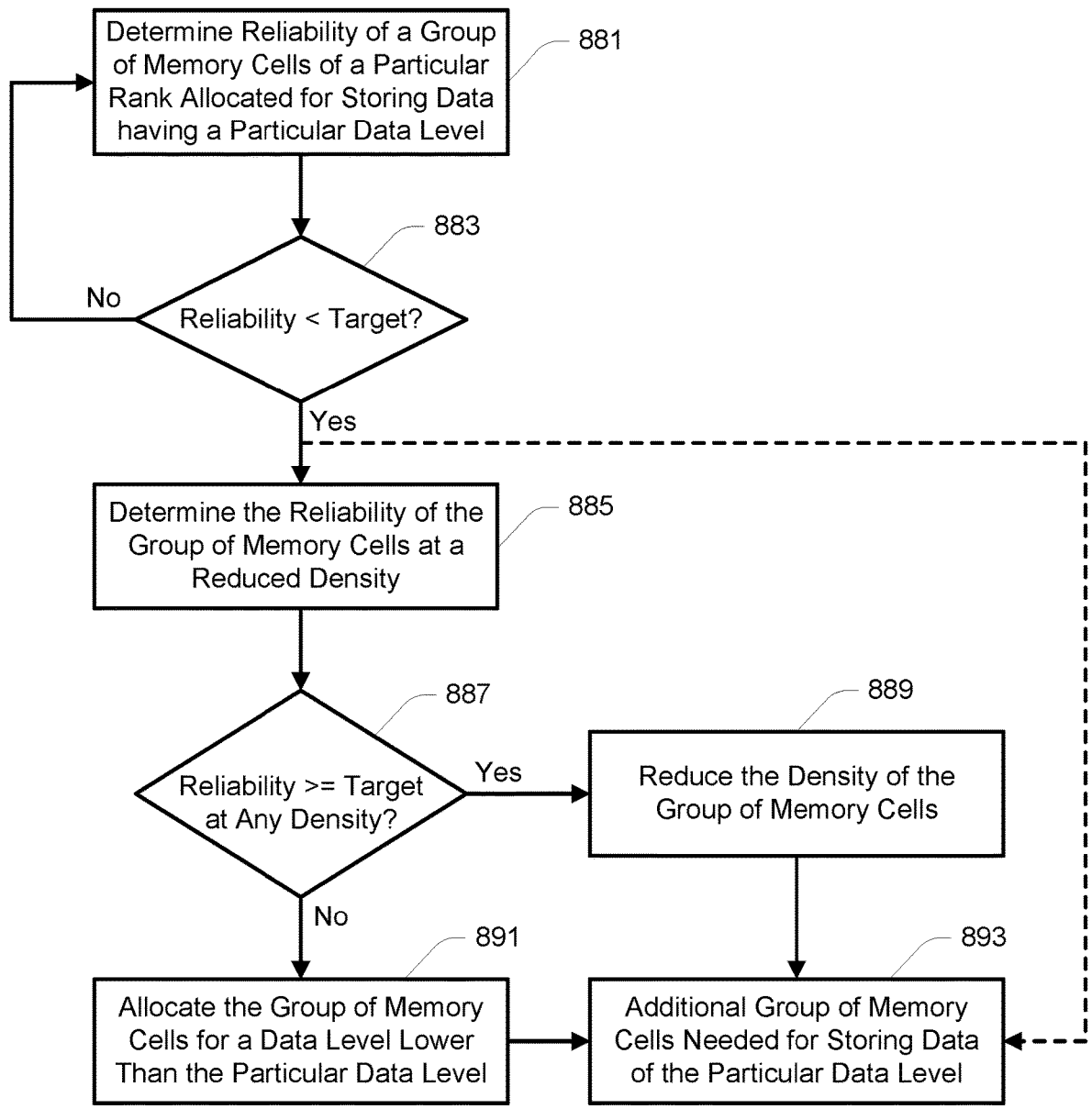
FIG. 8 is a flowchart of a method of operating an electronic system according to a further embodiment.

FIG. 8 is a flowchart of a method of operating an electronic system according to a further embodiment. The method of FIG. 7 might be performed in response to the actions of the method of FIG. 8, for example.

At 881, the reliability of a group of memory cells of a particular rank allocated for storing data having a particular data level is determined. Such a determination might be made in response to a command from a host device, and/or it might be made autonomously by a memory controller. The determination might be made in response to performing error correction, such as where a correctable, but undesirable, number of bit errors is detected. Alternatively, or in addition, the determination might be made periodically, based on time or usage metrics.

If the reliability of the group of memory cells is greater than or equal to a target reliability at 883, the process might return to 881. If the reliability is less than the target reliability at 883, the reliability of the group of memory cells might be determined at a reduced density at 885. Determining the reliability at the reduced density might include determining the reliability at a number of possible (e.g., to which the memory is configured to permit programming) memory densities.

If the reliability of the group of memory cells is greater than or equal to the target reliability at 887, the process might then proceed to 889, and the memory density of the group of memory cells for the particular data level might be reduced. For example, if the group of memory cells had been assigned the TLC memory density for the particular data level, and the reliability was found to be greater than or equal to the target reliability at the MLC memory density, the memory density of the group of memory cells for the particular data level might be reduced to the MLC memory density. The process might then proceed to 893, indicating a need for an additional group of memory cells for storing data of the particular data level. If the reliability of the group of memory cells is less than the target reliability at 887, the process might then proceed to 891, and the group of memory cells might be allocated for a data level lower than the particular data level.

For some embodiments, if the reliability of the group of memory cells is less than the target reliability at 883, the process might proceed to 893 without determining whether the target reliability might be attained by reducing the memory density. In such an embodiment, the group of memory cells might be allocated for a data level lower than the particular data level.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An electronic system, comprising:
   a plurality of groups of memory cells; and
   a controller for access of the plurality of groups of memory cells;
   wherein the controller is configured to cause the electronic system to:
   determine whether a reliability of a particular group of memory cells of the plurality of groups of memory cells having a particular reliability rank of a plurality of reliability ranks allocated for storing data of a particular data level of a plurality of data levels at a particular memory density of a plurality of memory densities is less than a target reliability;

in response to determining that the reliability of the particular group of memory cells at the particular memory density is less than the target reliability:
determine whether the reliability of the particular group of memory cells at a reduced memory density of the plurality of memory densities is less than the target reliability; and
in response to determining that the reliability of the particular group of memory cells at the reduced density is less than the target reliability, allocate the particular group of memory cells for storing data of a data level of the plurality of data levels lower than the particular data level, and allocate a different group of memory cells of the plurality of groups of memory cells for storing data of the particular data level.

2. The electronic system of claim 1, wherein the reduced memory density is a lowest memory density of the plurality of memory densities.

3. The electronic system of claim 1, wherein the controller being configured to cause the electronic system to determine whether the reliability of the particular group of memory cells at the reduced memory density is less than the target reliability comprises the controller being configured to cause the electronic system to determine, for each memory density of the plurality of memory densities lower than the particular memory density, whether the reliability of the particular group of memory cells at that memory density is less than the target reliability.

4. The electronic system of claim 1, wherein the controller being configured to cause the electronic system to allocate the particular group of memory cells for storing data of the data level of the plurality of data levels lower than the particular data level in response to determining that the reliability of the particular group of memory cells at the reduced density is less than the target reliability comprises the controller being configured to cause the electronic system to allocate the particular group of memory cells for storing data of the data level of the plurality of data levels lower than the particular data level in response to determining that the reliability of the particular group of memory cells is less than the target reliability for each memory density of the plurality of memory densities lower than the particular memory density.

5. The electronic system of claim 4, wherein the controller, in response to determining that the reliability of the particular group of memory cells is greater than the target reliability for at least one memory density of the plurality of memory densities lower than the particular memory density, is further configured to cause the electronic system to reduce the memory density of the particular group of memory cells, and to allocate the different group of memory cells for storing data of the particular data level.

6. The electronic system of claim 1, wherein the controller is configured to cause the electronic system to determine whether the reliability of the particular group of memory cells at the particular memory density is less than the target reliability in response to performing error correction.

7. The electronic system of claim 1, wherein the controller is configured to cause the electronic system to determine whether the reliability of the particular group of memory cells at the particular memory density is less than the target reliability on a periodic basis.

8. The electronic system of claim 1, wherein the controller is further configured to cause the electronic system to move or discard data of a different data level of the plurality of data levels from the different group of memory cells before allocating the different group of memory cells for storing data of the particular data level.

9. An electronic system, comprising:
a plurality of groups of memory cells; and
a controller for access of the plurality of groups of memory cells;
wherein the controller is configured to cause the electronic system to:
allocate a particular group of memory cells of the plurality of groups of memory cells having a particular reliability rank of a plurality of reliability ranks for storing data of a particular data level of a plurality of data levels at a particular memory density of a plurality of memory densities;
determine a need for an additional group of memory cells of the plurality of groups of memory cells for storing data of the particular data level;
move or discard data from a different group of memory cells of the plurality of groups of memory cells storing data of a different data level of the plurality of data levels in response to determining the need for the additional group of memory cells for storing data of the particular data level;
in response to the different group of memory cells having the particular reliability rank, allocate the different group of memory cells for storing data of the particular data level at the particular memory density; and
in response to the different group of memory cells having a second reliability rank of the plurality of reliability ranks, allocate the different group of memory cells for storing data of the particular data level at a second memory density of the plurality of memory densities.

10. The electronic system of claim 9, wherein the controller is further configured to cause the electronic system to:
determine a need for a second additional group of memory cells for storing data of the particular data level;
determine that a free group of memory cells having the particular reliability rank is available; and
allocate the free group of memory cells for storing data of the particular data level.

11. The electronic system of claim 9, wherein the controller being configured to cause the electronic system to move or discard the data from the different group of memory cells in response to determining the need for the additional group of memory cells for storing data of the particular data level comprises the controller being configured to cause the electronic system to move or discard the data from the different group of memory cells in response to determining the need for the additional group of memory cells for storing data of the particular data level when no free group of memory cells having the particular reliability rank is available.

12. The electronic system of claim 9, wherein the controller being configured to cause the electronic system to move or discard the data from the different group of memory cells in response to determining the need for the additional group of memory cells for storing data of the particular data level comprises the controller being configured to cause the electronic system to discard the data from the different group of memory cells in response to determining the need for the additional group of memory cells for storing data of the particular data level when no free group of memory cells having any reliability rank of the plurality of reliability ranks is available.

13. The electronic system of claim 12, wherein the controller being configured to cause the electronic system to discard the data from the different group of memory cells comprises the controller being configured to cause the electronic system to discard data of a lowest data level of the plurality of data levels.

14. The electronic system of claim 9, wherein the controller is further configured to cause the electronic system to:
in response to moving or discarding the data from the different group of memory cells:
determine a need for an additional group of memory cells for storing data of the different data level; and
move or discard data from a third group of memory cells storing data of a further data level of the plurality of data levels in response to determining the need for the additional group of memory cells for storing data of the different data level.

15. The electronic system of claim 9, wherein the controller is further configured to cause the electronic system to:
in response to the different group of memory cells having a third reliability rank of the plurality of reliability ranks, allocate the different group of memory cells for storing data of the particular data level at the particular memory density.

16. The electronic system of claim 9, wherein the controller being configured to cause the electronic system to move or discard the data from the different group of memory cells having the second reliability rank comprises the controller being configured to cause the electronic system to move or discard the data from a different group of memory cells of the plurality of groups of memory cells having a lower reliability rank of the plurality of reliability ranks than the particular reliability rank.

17. The electronic system of claim 15, wherein the controller being configured to cause the electronic system to move or discard the data from the different group of memory cells having the third reliability rank comprises the controller being configured to cause the electronic system to move or discard the data from a different group of memory cells of the plurality of groups of memory cells having a higher reliability rank of the plurality of reliability ranks than the particular reliability rank.

18. An electronic system, comprising:
a plurality of memory dies comprising a plurality of groups of memory cells; and
a controller for access of the plurality of groups of memory cells;
wherein each group of memory cells of the plurality of groups of memory cells has an assigned reliability rank of a plurality of reliability ranks;
wherein each reliability rank of the plurality of reliability ranks has an assigned maximum memory density of a plurality of memory densities for each data level of a respective subset of data levels of a plurality of data levels;
wherein, for each data level of the plurality of data levels, the assigned maximum memory density for that data level for any reliability rank of the plurality of reliability ranks is higher than or equal to the assigned maximum memory density for that data level for each lower reliability rank of the plurality of reliability ranks, and lower than or equal to the assigned maximum memory density for that data level for each higher reliability rank of the plurality of reliability ranks;
wherein, for each reliability rank of the plurality of reliability ranks, the assigned maximum memory density for at least one data level of the plurality of data levels is higher than the assigned maximum memory density for that data level for each lower reliability rank of the plurality of reliability ranks; and
wherein, for each data level of the plurality of data levels, the controller is configured to:
store data of that data level to a group of memory cells of the plurality of groups of memory cells having a reliability rank of the plurality of reliability ranks having an assigned maximum memory density for that data level; and
inhibit storage of the data of that data level to a group of memory cells of the plurality of groups of memory cells having a reliability rank of the plurality of reliability ranks having no assigned maximum memory density for that data level.

19. The electronic system of claim 18, wherein at least one memory die of the plurality of memory dies comprises a group of memory cells of the plurality of groups of memory cells having a reliability rank of the plurality of reliability ranks having an assigned maximum memory density for that data level, and comprises a group of memory cells of the plurality of groups of memory cells having a reliability rank of the plurality of reliability ranks having no assigned maximum memory density for that data level.

20. The electronic system of claim 18, wherein the controller is further configured to:
allocate a group of memory cells of a subset of the plurality of groups of memory cells having a particular reliability rank of the plurality of reliability ranks for storing data of a particular data level of the plurality of data levels;
determine a need for an additional group of memory cells for storing data of the particular data level;
move or discard data from a different group of memory cells storing data of a different data level of the plurality of data levels in response to determining the need for the additional group of memory cells for storing data of the particular data level; and
allocate the different group of memory cells for storing data of the particular data level.

21. The electronic system of claim 18, wherein, for each reliability rank of the plurality of reliability ranks, the respective subset of data levels for that reliability rank includes each data level of the respective subset of data levels for each lower reliability rank of the plurality of reliability ranks.

22. The electronic system of claim 21, wherein, for at least one reliability rank of the plurality of reliability ranks, the respective subset of data levels for that reliability rank includes a data level of the plurality of data levels not contained in the respective subset of data levels for each lower reliability rank of the plurality of reliability ranks.

\* \* \* \* \*